(12) United States Patent
Cheng

(10) Patent No.: US 6,588,866 B2
(45) Date of Patent: Jul. 8, 2003

(54) SLIDE RAIL ATTACHMENT

(75) Inventor: Alex S. Cheng, Steilacoom, WA (US)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 09/844,479

(22) Filed: Apr. 27, 2001

(65) Prior Publication Data

US 2002/0158556 A1 Oct. 31, 2002

(51) Int. Cl.[7] .............................................. A47B 88/00
(52) U.S. Cl. ................................ 312/334.7; 312/330.1
(58) Field of Search .......................... 312/333, 334.44, 312/334.46, 334.7, 334.1, 334.8, 348.1, 348.2, 350, 334.4, 330.1; 384/21, 22, 23, 20; 211/26; 361/725, 726, 727

(56) References Cited

U.S. PATENT DOCUMENTS

| | | | | |
|---|---|---|---|---|
| 3,679,274 A | * | 7/1972 | Nance .................... | 312/334.36 |
| 4,331,369 A | * | 5/1982 | Lazar et al. ............. | 312/334.8 |
| 4,384,746 A | * | 5/1983 | Ferdinand et al. ........ | 312/334.7 |
| 5,599,080 A | * | 2/1997 | Ho ......................... | 312/334.14 |
| 5,632,542 A | * | 5/1997 | Krivec .................... | 312/334.7 |
| 5,653,518 A | * | 8/1997 | Hardt ...................... | 312/334.4 |
| 5,683,159 A | * | 11/1997 | Johnson ................... | 312/223.2 |
| 6,199,967 B1 | * | 3/2001 | Bayles et al. ........... | 248/222.11 |
| 6,209,979 B1 | * | 4/2001 | Fall et al. ................ | 312/319.1 |

OTHER PUBLICATIONS

Jonathan "Slide Selection Guide", before 1 year before Apr. 27, 2001.

* cited by examiner

*Primary Examiner*—Janet M. Wilkens
(74) *Attorney, Agent, or Firm*—Fish & Richardson P.C.

(57) ABSTRACT

A component chassis of a server is installed into a rack with a quick-disconnect slide rail. The inner rail member is secured to the component chassis by a quick-connect system having multiple headed protrusions received in corresponding keyhole slots in the rail web, and then slid along the slots until a spring latch snaps into place, without the use of tools. The component chassis, with its attached inner rail members, is then slid into place by inserting the inner rail members in mating outer rail members pre-installed on the rack.

22 Claims, 5 Drawing Sheets

SLIDE RAIL ATTACHMENT

TECHNICAL FIELD

This invention relates to the attachment of slide rails, such as for extendable rack-mounted electronic components, and such.

BACKGROUND

Computer systems are frequently comprised of several discrete components, each packaged in a serviceable box or chassis of a common width and one of various standard heights. Several such components of a system may be mounted in a rack designed to enable the components to be individually removed for service or replacement. Flanges of the components may be bolted, for example, in any number of positions along a vertical series of holes along the rack.

To improve serviceability, some computer server components have been mounted into racks on extendable slide rails, such as are employed on desk and cabinet drawers. One elongated portion of a rail is firmly attached to the server component chassis, such as by screws, and a mating portion of the rail is rigidly secured to the rack. The two mating portions of the rail can slide in relation to each other on bearing surfaces, between stops, to enable the component to be readily pulled partially from the rack for maintenance or service. The two mating portions of some slide rails can be disconnected from each other to completely remove the server component, with its portions of two corresponding slide rails still attached, from the rack.

DETAILED DESCRIPTION

Figure 1:
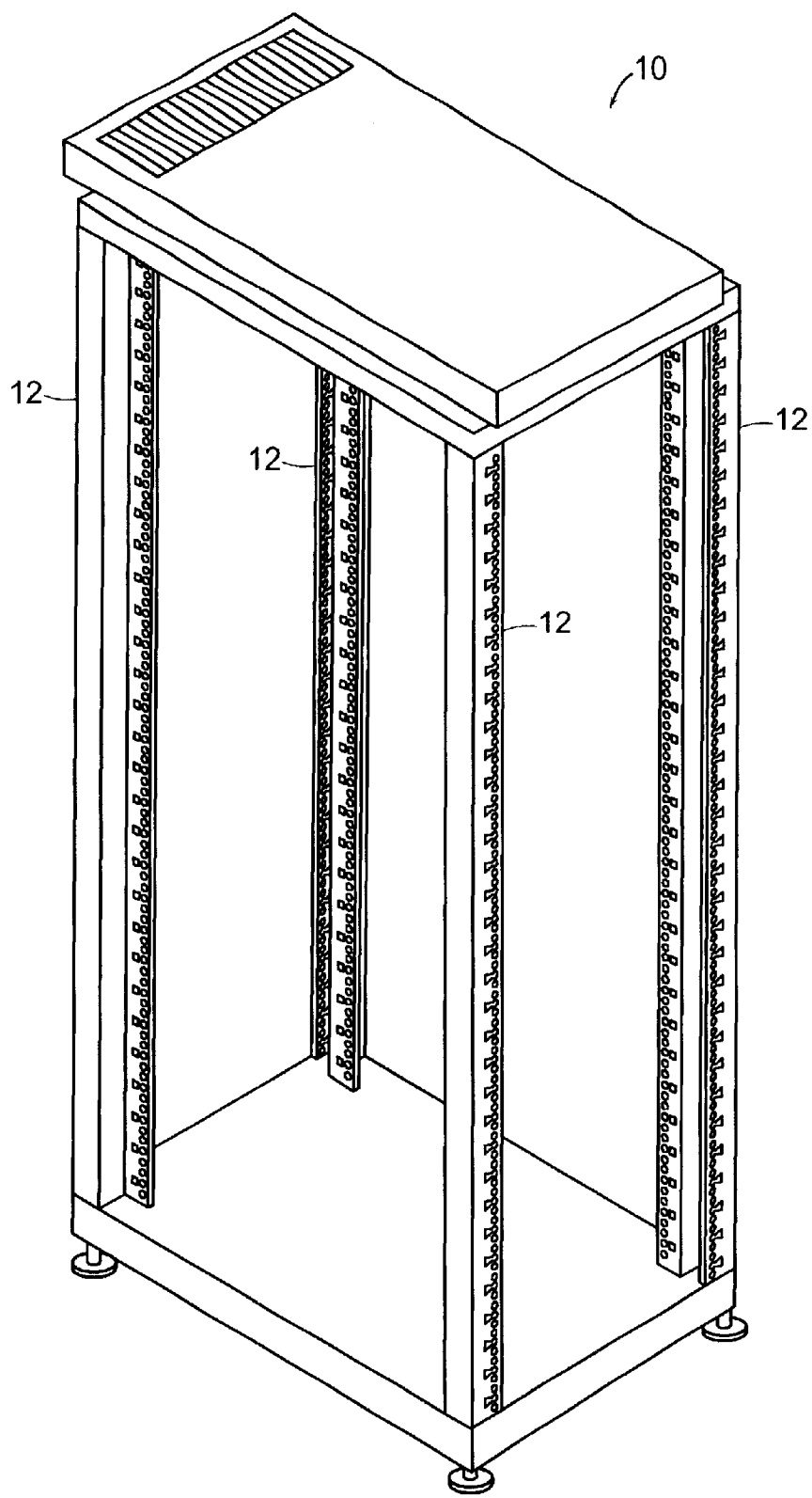
FIG. 1 is a perspective view of a component rack.

In FIG. 1, a rack 10 as known in the art has four upright, metal beams 12 provided with corresponding series of mounting holes for mounting brackets and rails supporting computer and other electronic equipment at various elevations in the rack. The beam and hole spacing of such racks has become somewhat standard in the industry.

Figure 2:
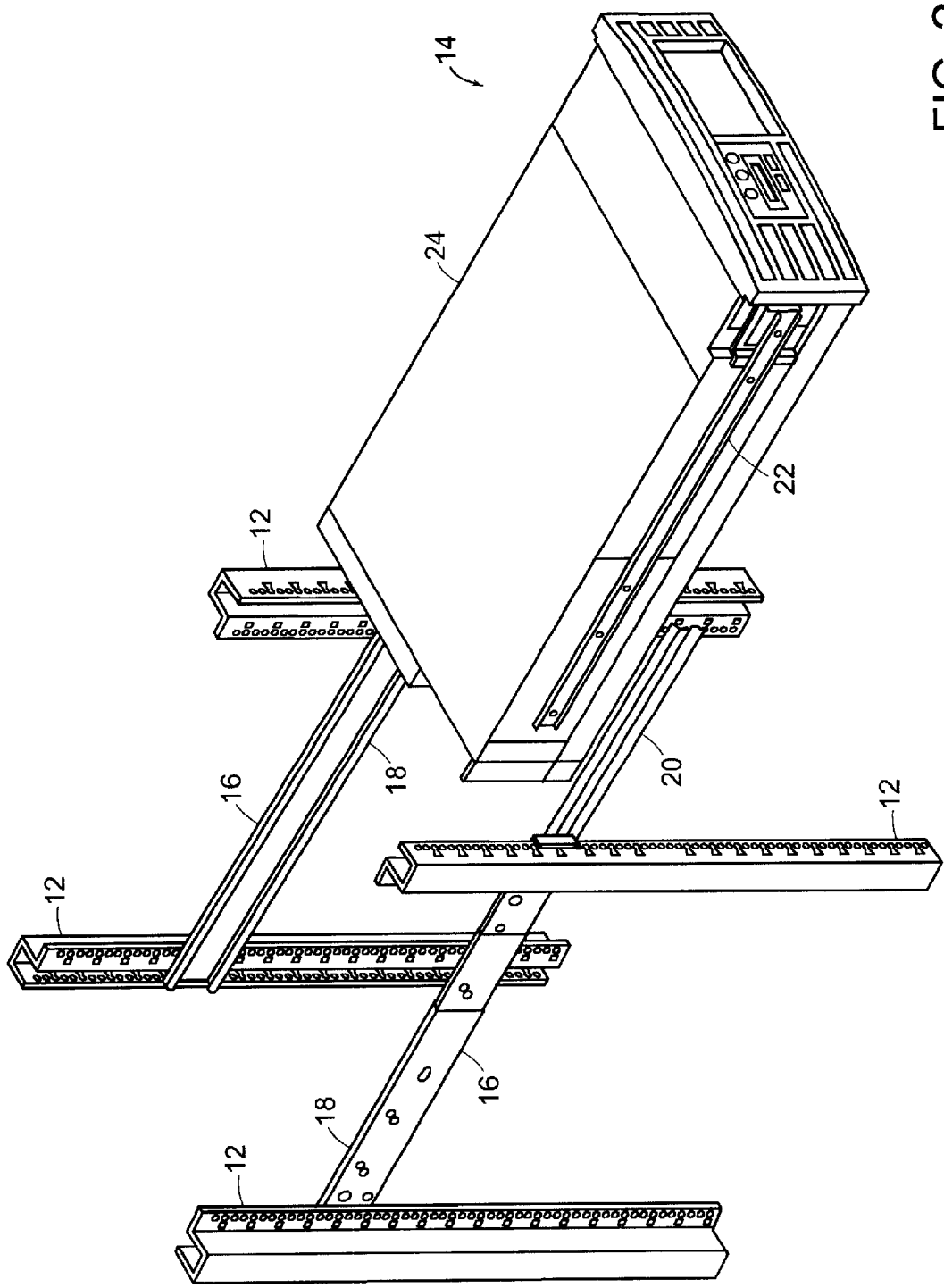
FIG. 2 shows the mounting of a component chassis to a rack with two slide rails.

As shown in FIG. 2, a single computer component 14 is mounted to the upright beams 12 of the rack with a pair of extendable slides 16. Each slide 16 consists of three elongated members forming a telescoping assembly. An outer member 18 is mounted rigidly between two upright beams 12 on each side of the rack, such as by threaded fasteners. An intermediate member 20 travels within a track defined by outer member 18, on a series of roller bearings. When fully extended, the travel of intermediate member 20 is limited by a mechanical stop (not visible in this view). When retracted, the intermediate member is contained within the length of the outer member 18. An inner member 22 (shown detached from the rest of the slide rail) is rigidly secured to the chassis 24 of component 14, by means described more fully below. To install component 14 into the rack, its attached inner slide members 22 are slid into the intermediate members 20 that are already secured in the outer members 18 attached to the rack. For local service, component 14 can be pulled from the rack by extending the slides 16. If more extensive service or replacement is required, however, inner members 22 can be slid out of their respective intermediate slide members 20 to completely remove the component from the rack, without disassembling the inner slide members 22 from the component chassis 24 or detaching the outer slide members 18 from the rack.

Outer slide member 18 may be rigidly secured to the rack by any appropriate attachment means, such as threaded fasteners, rivets or quick-release pins. The outer slide member may be permanently secured to the rack, if desired, although it is preferably removable for replacement or repositioning.

Figure 3:
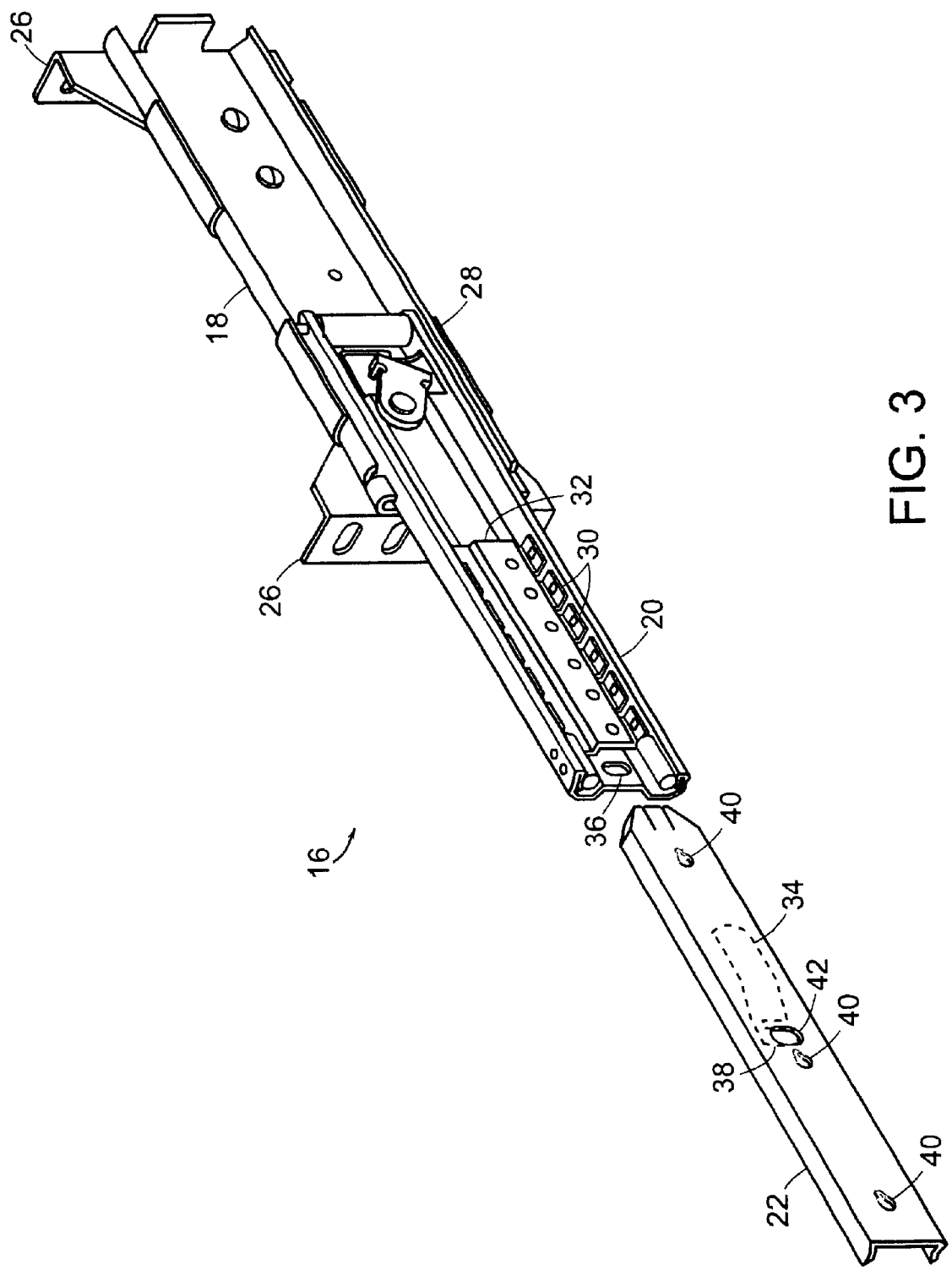
FIG. 3 is an exploded, perspective view of a three-section, quick-release slide rail.

More detail of the slide assembly 16 is visible in FIG. 3. Outer slide member 18 includes two spaced-apart brackets 26 with holed flanges for mounting the slide in a rack. An rear stop 28 limits the travel of intermediate member 20 in one direction, while a releasable catch 28 of the intermediate member engages a tab (not shown) along the web of outer member 18 when the intermediate member is fully extended, to limit travel in the other direction. Catch 28 is pivotably attached to intermediate member 20, and latches intermediate member 20 to outer member 18 at full extension. When inner member 22 has been fully retracted, it engages and rotates catch 28 to enable subsequent retraction of intermediate member 20, ensuring sequential retraction. Multiple bearing balls 30 are held within ball retainer 32 to provide for rolling contact between intermediate member 20 and inner member 22. A similar retainer and series of balls (not shown) form the rolling interface between intermediate member 20 and outer member 18.

A spring clip 34 extends from the outboard side of the web of inner member 22 to engage the edge of a hole 36 through the web of intermediate member 20 when the inner member is fully extended. Once fully extended, the engagement of clip 34 with hole 36 also prohibits retraction of the inner member within the intermediate member without manually compressing clip 34 for disengagement. A distal, free end 38 of clip 34 is exposed beyond the web of intermediate member 20 with the inner member fully extended, for manipulation. Manually compressing and disengaging clip 34 also releases inner member 22 for complete removal from the intermediate member.

Figure 4:
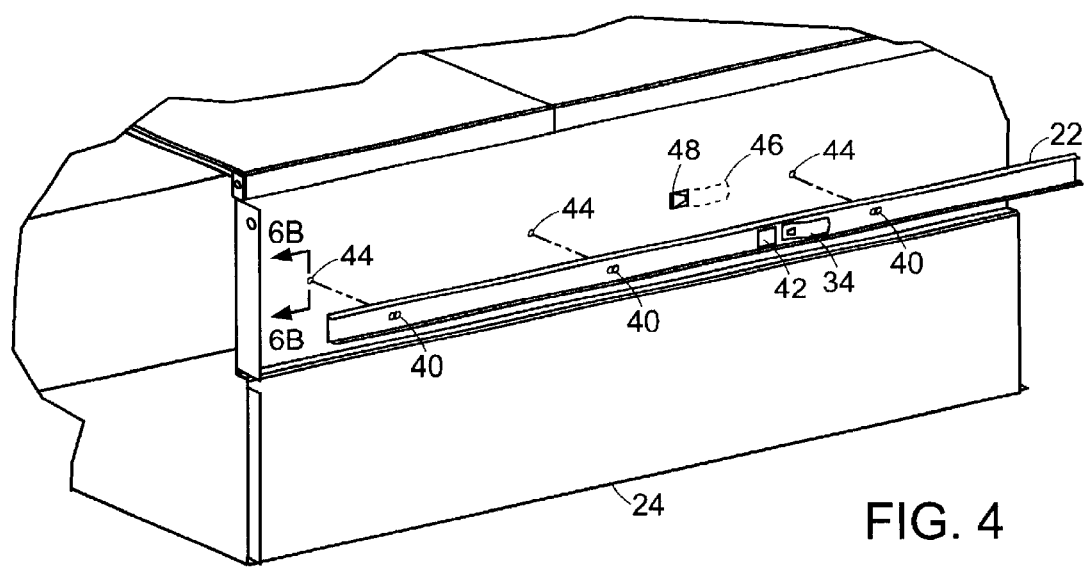
FIGS. 4 and 5 illustrate the mounting of the inner slide rail member to a component chassis.
Figure 5:
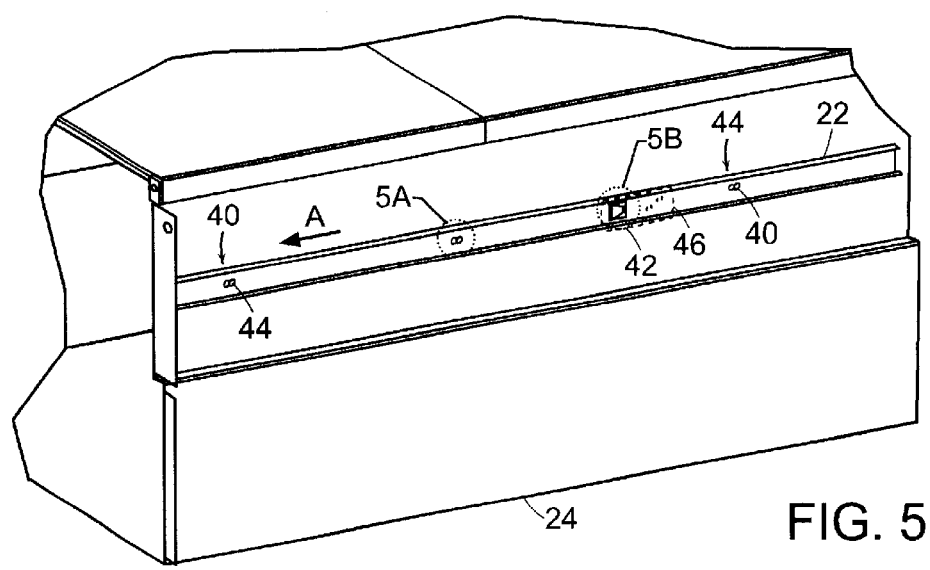

Inner member 22 is also provided with three keyhole slots 40 through its central web, and a single aperture 42, for quick mounting of the inner member to a component housing without the use of tools, as illustrated in FIGS. 4 and 5. Housing 24 has a corresponding series of three standoff projections 44 that are received in enlarged ends of keyhole slots 40, and a spring clip 46 (described in more detail below) exposed through an aperture 48 through the housing wall to engage an edge of aperture 42 of the inner slide member 22.

Figure 5A:
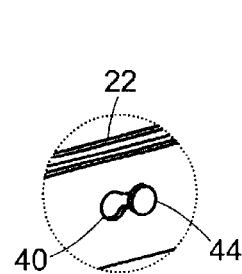
FIGS. 5A and 5B are enlarged views of areas 5A and 5B, respectively, of FIG. 5.
Figure 5B:
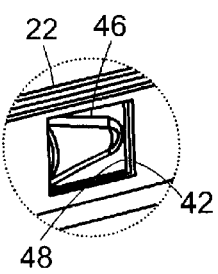

After the inner slide rail member 22 is moved toward the side of the component housing 24 in a normal direction until the heads of projections 44 have passed through the larger ends of keyhole slots 40 (FIG. 4), the inner slide rail member 22 is slid forward along component housing 24 in the direction of arrow "A" (FIG. 5) until spring clip 46 snaps into aperture 42 of the inner rail member (see also FIG. 5B) to secure the inner rail member against being slid in the opposite direction, with the heads of projections 44 overlapping the web of the inner rail member in the vicinity of keyhole slots 40 (see also FIG. 5A) to retain the inner member against the side of the component housing.

Figure 6A:
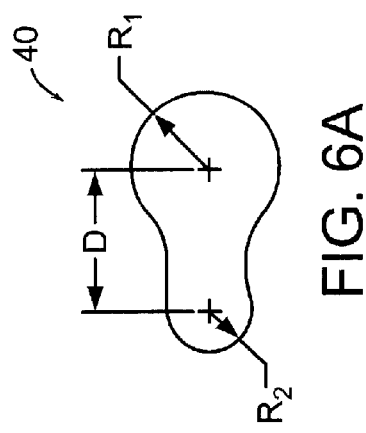
FIG. 6A shows detail of the keyhole slot seen in FIG. 5A.

FIG. 6A shows the profile of the keyhole slots 40 of the inner slide member. The larger end has a radius $R_1$ of about 0.155 inch (3.94 millimeters), while the smaller end has a radius $R_2$ of about 0.1 inch (2.5 millimeters). The centers of the arcs defining the two ends are separated by a distance "D" of about 0.3 inch (7.6 millimeters).

Figure 6B:
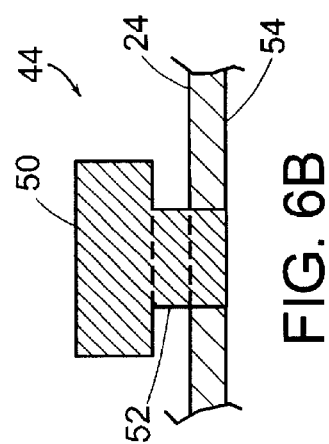
FIG. 6B is a cross-sectional view through a standoff projection, taken along line 6B—6B in FIG. 4.

The structure of one of the corresponding steel standoff projections 44 is shown in FIG. 6B. The circular standoff has a head 50 with an overall diameter of about 0.275 inch (7.0 millimeters) and a thickness of about 0.1 inch (2.5 millimeters). This head is integrally formed with a stem 52 having a diameter of about 0.195 inch (5.0 millimeters) that is knurled and pressed into a hole in the component housing wall until the inner end of the stem is flush with the inner surface 54 of the housing 24, which is formed of steel having a nominal wall thickness of about 0.48 inch (12 millimeters). Once assembled to the component housing, the inner surface of head 50 of projection 44 is disposed about 0.05 inch (1.3 millimeters) from the outer surface of the housing, for receiving the nominal thickness of the web of the inner slide member beneath the projection head. Because head 52 has a thickness of only about 0.1 inch (2.5 millimeters), in the final assembly it extends only about 0.1 inch (2.5 millimeters) beyond the outer surface of the inner slide member and does not interfere with the retraction of the inner slide member within the intermediate slide member. The dimensional tolerances, and nominal clearance between projection 44 and the inner slide member keyhole slot, should be chosen to minimize free play in the final assembly, while still enabling assembly by hand.

Figure 7:
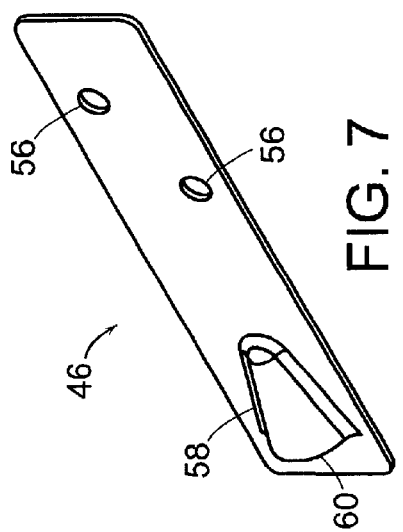
FIG. 7 is a perspective view of a spring clip.
Figure 8:
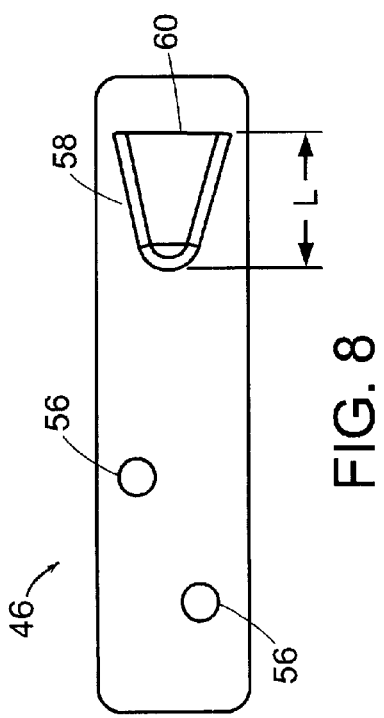
FIGS. 8 and 9 are face and side views, respectively, of the spring clip of FIG. 7.
Figure 9:
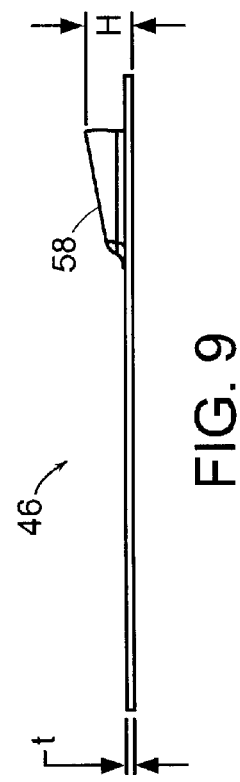

Referring now to FIGS. 7–9, elongated spring clip 46 is formed of ¼-hard spring steel having a nominal thickness "t" of about 0.025 inch (0.64 millimeter). Two holes 56 through the clip are for permanently securing the clip to the inner surface of the component housing, either by threaded fasteners, rivets, staking or other attachment means. Spaced longitudinally from holes 56 is a raised wedge 58 having length "L" of about 0.56 inch (14 millimeters) and height "H" of about 0.15 inch (3.8 millimeters), formed of the same sheet stock by a punch-forming operation. Wedge 58 has a distal edge 60 for engaging the edge of the aperture in the inner slide member web. The length of clip 46 between holes 56 and wedge 58 enables the clip to be flexed out of its plane to deflect into the component housing as the inner slide member web is pressed against wedge 58. The resiliency of the material causes wedge 58 to spring back to its original position once aligned with inner member aperture 42 (see FIG. 5B).

Other embodiments are within the scope of the following claims. For example, other hand-manipulable or automatic locking means may be employed instead of a spring clip, such as a plunger alignable with a hole, to lock the inner slide member to the component housing once slid into position. The keyhole slots and standoffs may be fashioned of many different profiles and structures, enabling different motion sequences and directions for attaching the inner rail member. The standoffs can be secured to the inner slide member, with corresponding keyhole slots in the component housing. Multiple spring clips may be employed to further reduce any risk of inadvertent release. These are but a few of the variations that are envisioned within the spirit and scope of the invention as claimed.

What is claimed is:

1. Apparatus comprising:

a first elongated rail member attachable to a rack defining an opening sized to slidingly receive an electronic system component chassis; and a second elongated rail member attachable to the component chassis, the second rail member configured for sliding coupling with the first rail member to enable the chassis to be moved with respect to the rack;

the second rail member having a quick-connect feature adapted to engage a mating feature of the component chassis to secure the second rail member to the chassis, the quick-connect feature being adapted to receive said mating feature of the component chassis in a first engagement position, and then to slide with respect to the mating feature in a direction extending along the second rail member, to a securement position to secure the second rail member to the chassis, one of the second rail member and the component chassis comprising a securement latch positioned to engage a corresponding latch receiver of the other of the second rail member and the component chassis when the quick-connect feature is in its securement position, to restrict relative motion between, and separation of, the second rail member and the component chassis, the securement latch being biased toward the other of the second rail member and the component chassis, for automatically seating the securement latch upon alignment of the securement latch and latch receiver, the securement latch being attached to a side of one of the second rail member and the component chassis that is facing away from the other of the second rail member and the component chassis, the securement latch comprising an inclined surface that rises from a narrower leading end to a broader trailing end, the one of the second rail member and the component chassis having an opening to allow the inclined surface to protrude from the side of one of the second rail member and the component chassis towards the other of the second rail member and the component chassis, to cause the securement latch to be urged away from the other of the second rail member and the component chassis as the quick-connect feature is moved towards its securement position, the trailing end terminating in a stop edge that mates with the latch receiver to secure the second rail member to the chassis when the quick-connect feature reaches the securement position.

2. The apparatus of claim 1 further comprising a releasable extension stop for removing the second rail member from the first rail member.

3. The apparatus of claim 1 wherein one of the quick-connect feature and the mating feature comprises a headed protrusion, extending from a corresponding one of the second rail member and the component chassis, and wherein the other of the quick-connect feature and the mating feature comprises a slot sized to slidingly receive the protrusion.

4. The apparatus of claim 3 wherein the slot has a wide end for receiving an enlarged head of the protrusion into the slot, and a narrow end for retaining the protrusion once received.

5. The apparatus of claim 3 wherein the headed protrusion has a shank extending from a side of said corresponding one of the second rail member and the component chassis to a distal head overhanging said side.

6. The apparatus of claim 5 wherein the distal head has a thickness, measured in a direction perpendicular to said side, of less than about 0.15 inch.

7. The apparatus of claim 1 wherein the securement latch is of the component chassis, and the latch receiver is of the second rail member.

8. The apparatus of claim 7 wherein the latch receiver is in the form of a hole defined in the second rail member and spaced apart along the second rail member from the quick-connect feature.

9. Apparatus comprising:
a first elongated rail member attachable to a rack defining an opening sized to slidingly receive an electronic system component chassis; and
a second elongated rail member attachable to the component chassis, the second rail member configured for sliding coupling with the first rail member to enable the chassis to be moved with respect to the rack, the second rail member defining
multiple, longitudinally spaced apart, slotted holes positioned to receive corresponding headed protrusions of the component chassis in an engagement position, the slotted holes being elongated to enable the received protrusions to slide to a securement position, and
a latch-receiving hole positioned to align with and receive a securement latch of the component chassis when the protrusions are in their securement position, to secure the second rail member to the chassis,
the securement latch being attached to an inner side of component chassis facing away from the second rail member, the securement latch comprising an inclined surface that rises from a narrower leading end to a broader trailing end, the component chassis having an opening to allow the inclined surface to protrude from the inner side of the component chassis towards the second rail member, to cause the securement latch to be urged away from the second rail member as the securement latch is moved towards its securement position, the trailing end terminating in a stop edge that mates with the latch receiving hole to secure the second rail member to the chassis when the securement latch feature reaches the securement position.

10. The apparatus of claim 9 wherein each slotted hole has a wide end for receiving an enlarged head of the protrusion into the slot, and a narrow end for retaining the protrusion once received.

11. Apparatus comprising:
a first elongated rail member attachable to a rack defining an opening sized to slidingly receive an electronic system component chassis; and
a second elongated rail member attachable to the component chassis, the second rail member configured for sliding coupling with the first rail member to enable the chassis to be moved with respect to the rack;
the second rail member having means for connecting the second rail member to the component chassis by placing the second rail member against the component chassis in an engagement position, and then sliding the second rail member along the component chassis to a securement position, to longitudinally secure the second rail member to the chassis,
one of the second rail member and the component chassis comprising a securement latch positioned to engage a corresponding latch receiver of the other of the second rail member and the component chassis when the second rail member is in its securement position, to restrict relative motion between, and separation of, the second rail member and the component chassis, the securement latch being biased toward the other of the second rail member and the component chassis, for automatically seating the securement latch upon alignment of the securement latch and latch receiver,
the securement latch being attached to a side of one of the second rail member and the component chassis that is facing away from the other of the second rail member and the component chassis, the securement latch comprising an inclined surface that rises from a narrower leading end to a broader trailing end, the one of the second rail member and the component chassis having an opening to allow the inclined surface to protrude from the side of one of the second rail member and the component chassis towards the other of the second rail member and the component chassis, to cause the securement latch to be urged away from the other of the second rail member and the component chassis as second rail member is moved towards its securement position, the trailing end terminating in a stop edge that mates with the latch receiver to secure the second rail member to the chassis when the second rail member reaches the securement position.

12. The apparatus of claim 11 wherein said means for connecting the second rail member is adapted to secure the second rail member to the component chassis without tools.

13. A method of installing a component chassis into a rack, the method comprising:
securing a first elongated rail member of a slide rail to the rack;
securing a second elongated rail member of the slide rail to the component chassis by
engaging a quick-connect feature of the second rail member to a mating feature of the component chassis, and then
sliding the second rail member with respect to the component chassis to align a securement latch; and
attaching the first and second rail members of the slide rail to each other for slidable engagement,
the securement latch being positioned to engage a corresponding latch receiver, the securement latch being attached to a side of one of the second rail member and the component chassis that is facing away from the other of the second rail member and the component chassis, the securement latch being biased toward the other of the second rail member and the component chassis, for automatically seating the securement latch upon alignment of the securement latch and latch receiver, the securement latch comprising an inclined surface that rises from a narrower leading end to a broader trailing end, the one of the second rail member and the component chassis having an opening to allow the inclined surface to protrude from the side of one of the second rail member and the component chassis towards the other of the second rail member and the component chassis, to cause the securement latch to be urged away from the other of the second rail member or the component chassis as the second rail member is moved towards a securement position, the trailing end terminating in a stop edge that mates with the latch receiver to secure the second rail member to the chassis when the second rail member reaches the securement position.

14. The method of claim 13 wherein the second elongated rail member is secured to the component chassis before the first and second rail members of the slide rail are attached to each other.

15. The method of claim 13 wherein one of the quick-connect feature and the mating feature comprises a headed protrusion, extending from a corresponding one of the second rail member and the component chassis, and wherein the other of the quick-connect feature and the mating feature comprises a slot sized to slidingly receive the protrusion, the method including sliding the protrusion along the slot.

16. The method of claim 15 wherein the slot is has a wide end for receiving an enlarged head of the protrusion into the slot, and a narrow end for retaining the protrusion once received.

17. The method of claim 15 wherein the headed protrusion has a shank extending from a side of said corresponding one of the second rail member and the component chassis to a distal head overhanging said side.

18. The method of claim 17 herein the distal head has a thickness, measured in a direction perpendicular to said side, of less than about 0.15 inch.

19. The method of claim 13 wherein the securement latch is biased to automatically seat into the latch receiver when the latch and the latch receiver are longitudinally aligned.

20. The method of claim 19 wherein the securement latch is of the component chassis, and the latch receiver is of the second rail member.

21. The method of claim 20 wherein the latch receiver is in the form of a hole defined in the second rail member and spaced apart along the second rail member from the quick-connect feature.

22. The method of claim 20 wherein the securement latch comprises a spring steel clip secured to an inner surface of the component chassis and exposed for engagement with the latch receiver through an aperture in the component chassis.

* * * * *